(12) United States Patent
Saito et al.

(10) Patent No.: US 10,020,390 B2
(45) Date of Patent: Jul. 10, 2018

(54) SEMICONDUCTOR DEVICE AND SEMICONDUCTOR DEVICE MANUFACTURING METHOD

(71) Applicants: Jun Saito, Nagoya (JP); Hirokazu Fujiwara, Miyoshi (JP); Tomoharu Ikeda, Nisshin (JP); Yukihiko Watanabe, Nagoya (JP); Toshimasa Yamamoto, Ichinomiya (JP)

(72) Inventors: Jun Saito, Nagoya (JP); Hirokazu Fujiwara, Miyoshi (JP); Tomoharu Ikeda, Nisshin (JP); Yukihiko Watanabe, Nagoya (JP); Toshimasa Yamamoto, Ichinomiya (JP)

(73) Assignees: TOYOTA JIDOSHA KABUSHIKI KAISHA, Toyota (JP); DENSO CORPORATION, Kariya (JP)

( * ) Notice: Subject to any disclaimer, the term of this patent is extended or adjusted under 35 U.S.C. 154(b) by 19 days.

(21) Appl. No.: 15/107,313

(22) PCT Filed: Aug. 4, 2014

(86) PCT No.: PCT/JP2014/070521
§ 371 (c)(1),
(2) Date: Jun. 22, 2016

(87) PCT Pub. No.: WO2015/098168
PCT Pub. Date: Jul. 2, 2015

(65) Prior Publication Data
US 2017/0012121 A1    Jan. 12, 2017

(30) Foreign Application Priority Data
Dec. 26, 2013 (JP) .................... 2013-269265

(51) Int. Cl.
*H01L 29/78* (2006.01)
*H01L 29/06* (2006.01)
(Continued)

(52) U.S. Cl.
CPC ........ *H01L 29/7811* (2013.01); *H01L 21/047* (2013.01); *H01L 29/063* (2013.01);
(Continued)

(58) Field of Classification Search
CPC ............. H01L 29/7811; H01L 29/0623; H01L 29/063; H01L 21/76237
See application file for complete search history.

(56) References Cited

U.S. PATENT DOCUMENTS

| 5,712,502 A * | 1/1998 | Mitlehner | ........... H01L 29/0615 |
| | | | 257/341 |
| 8,680,613 B2 * | 3/2014 | Guan | .................... H01L 29/407 |
| | | | 257/330 |

(Continued)

FOREIGN PATENT DOCUMENTS

| JP | 2008-135522 A | 6/2008 |
| JP | 2010-114152 A | 5/2010 |

*Primary Examiner* — Tom Thomas
*Assistant Examiner* — John Bodnar
(74) *Attorney, Agent, or Firm* — Oliff PLC

(57) ABSTRACT

A technique achieving a higher voltage resistance by a depletion layer extending quickly within a circumferential region is provided. A semiconductor device includes an element region in which an insulated gate type switching element is provided and a circumferential region adjacent to the element region. First and second trenches are provided in the circumferential region. A front surface region of the second-conductivity-type is provided between the first and second trenches. First and second bottom surface regions of the second-conductivity-type are provided in bottom surface ranges of the first and second trenches. First and second side surface regions of the second-conductivity-type connecting (Continued)

the front surface region and the first or second bottom surface region is provided along side surfaces of the first and second trenches. Low area density regions are provided in at least parts of the first and second side surface regions.

9 Claims, 13 Drawing Sheets

(51) Int. Cl.
| | | |
|---|---|---|
| *H01L 29/10* | (2006.01) | |
| *H01L 29/40* | (2006.01) | |
| *H01L 29/16* | (2006.01) | |
| *H01L 29/66* | (2006.01) | |
| *H01L 21/04* | (2006.01) | |
| *H01L 21/265* | (2006.01) | |

(52) U.S. Cl.
CPC ...... *H01L 29/0623* (2013.01); *H01L 29/0696* (2013.01); *H01L 29/1095* (2013.01); *H01L 29/1608* (2013.01); *H01L 29/408* (2013.01); *H01L 29/66068* (2013.01); *H01L 29/7813* (2013.01); *H01L 21/26586* (2013.01)

(56) References Cited

U.S. PATENT DOCUMENTS

| | | | |
|---|---|---|---|
| 8,872,266 B1 * | 10/2014 | Hsu | H01L 21/76237 |
| | | | 257/270 |
| 2014/0027841 A1 * | 1/2014 | Bhalla | H01L 29/1095 |
| | | | 257/330 |

* cited by examiner

SEMICONDUCTOR DEVICE AND SEMICONDUCTOR DEVICE MANUFACTURING METHOD

CROSS-REFERENCE TO RELATED APPLICATIONS

This application is a related application of Japanese Patent Application No. 2013-269265 filed on Dec. 26, 2013 and claims priority to this Japanese Patent Application, the entire contents of which are hereby incorporated by reference into the present application.

TECHNICAL FIELD

The technique disclosed herein relates to a semiconductor device.

BACKGROUND ART

Japanese Patent Application Publication No. 2008-135522 (hereinbelow referred to as Patent Literature 1) discloses a semiconductor device including an element region in which a MOS structure is provided, and a circumferential region on a periphery of this region. The circumferential region has a plurality of trenches provided so as to surround the element region, and an insulating layer is filled in each trench. A p-type bottom-surface surrounding region is provided at a lower end of each trench in the circumferential region. When a MOSFET is turned off, a depletion layer extends from the element region to the circumferential region. At this occasion, the respective bottom-surface surrounding regions enhance the extension of the depletion layer. Due to this, according to this structure, a high voltage resistance can be realized.

SUMMARY

Technical Problem

In the semiconductor device of Patent Literature 1, when the depletion layer extending from the element region reaches the first bottom-surface surrounding region within the circumferential region (the bottom-surface surrounding region closest to the element region), the depletion layer extends from the first bottom-surface surrounding region toward the second bottom-surface surrounding region (the second bottom-surface surrounding region from the element region). When the depletion layer reaches the second bottom-surface surrounding region, the depletion layer extends from the second bottom-surface surrounding region toward the third bottom-surface surrounding region. Accordingly, since the depletion layer extends gradually through the respective bottom-surface surrounding regions, a speed by which the depletion layer extends is not so fast. Accordingly, this description provides a technique that is capable of realizing a higher voltage resistance by quickly extending a depletion layer in a circumferential region.

Solution to Problem

A semiconductor device disclosed herein comprises a semiconductor substrate, a front surface electrode provided on a front surface of the semiconductor substrate, and a rear surface electrode provided on a rear surface of the semiconductor substrate. The semiconductor substrate comprises an element region in which an insulated gate type switching element configured to switch between the front surface electrode and the rear surface electrode is provided, and a circumferential region adjacent to the element region. The insulated gate type switching element comprises a first region of a first conductivity type connected to the front surface electrode, a second region of a second conductivity type connected to the front surface electrode and being in contact with the first region, a third region of the first conductivity type provided under the second region and separated from the first region by the second region, a gate insulating film being in contact with the second region, and a gate electrode facing the second region via the gate insulating film. A first trench and a second trench spaced apart from the first trench are provided in the front surface in the circumferential region. Insulating films are provided in the first trench and the second trench. A front surface region of the second conductivity type is provided in a front surface side portion of a region between the first trench and the second trench. A first bottom surface region of the second conductivity type is provided in a range exposed on a bottom surface of the first trench. A second bottom surface region of the second conductivity type is provided in a range exposed on a bottom surface of the second trench. A first side surface region of the second conductivity type connecting the front surface region and the first bottom surface region is provided along a side surface of the first trench. A second side surface region of the second conductivity type connecting the front surface region and the second bottom surface region is provided along a side surface of the second trench. A fourth region of the first conductivity type continuous from the third region is provided in a range where the fourth region is in contact with the front surface region, the first bottom surface region, the second bottom surface region, the first side surface region, and the second side surface region. A first low area density region is provided in at least a part of the first side surface region. An area density of second conductivity type impurities in the first low area density region measured along a direction perpendicular to the side surface of the first trench is lower than an area density of second conductivity type impurities in the first bottom surface region measured along a thickness direction of the semiconductor substrate. The first bottom surface region is separated from the front surface region by the first low area density region. A second low area density region is provided in at least a part of the second side surface region. An area density of second conductivity type impurities in the second low area density region measured along a direction perpendicular to the side surface of the second trench is lower than an area density of second conductivity type impurities in the second bottom surface region measured along the thickness direction of the semiconductor substrate. The second bottom surface region is separated from the front surface region by the second low area density region.

In this semiconductor device, a depletion layer extends from the second region into the third region upon when the insulated gate type switching element turns off. In a vicinity of a boundary between the element region and the circumferential region, the depletion layer extends towards the first bottom surface region. Here, in the circumferential region, the first bottom surface region, the first side surface region, the front surface region, the second side surface region, and the second bottom surface region are connected to each other (hereinbelow, these regions connected to each other will be called an outer circumferential second conductivity type region). Thus, when the depletion layer reaches the first bottom surface region, the depletion layer extends from an entirety of the outer circumferential second conductivity type region into the fourth region. That is, the region under the plurality of trenches is depleted at once. Accordingly, in this semiconductor device, the depletion layer can be extended quickly within the circumferential region. Further, upon when the insulated gate type switching element turns off, the depletion layer extends in the outer circumferential second conductivity type region as well. Here, the outer circumferential second conductivity type region includes the first low area density region and the second low area density region. These regions have low second conductivity type impurity area density, thus they are more prone to being depleted than the other outer circumferential second conductivity type region. Thus, the first low area density region and the second low area density region are depleted upon when the insulated gate type switching element turns on. Due to this, the first bottom surface region, the front surface region, and the second bottom surface region are separated from each other by the depletion layer. Due to this, a potential difference can be generated within the outer circumferential second conductivity type region, and potentials can further be distributed evenly within the circumferential region. Thus, the semiconductor device has a high voltage resistance.

In the above mentioned semiconductor device, the semiconductor substrate may be configured of SiC, and the area density in the first low area density region and the area density in the second low area density region may be lower than $3.2 \times 10^{13}$ cm$^{-2}$.

In the above mentioned semiconductor device, the semiconductor substrate may be configured of Si, and the area density in the first low area density region and the area density in the second low area density region may be lower than $2.0 \times 10^{12}$ cm$^{-2}$.

According to this configuration, each of the low area density regions can be depleted.

In the above mentioned semiconductor device, the semiconductor substrate may be configured of SiC, and the area density in the first bottom surface region and the area density in the second bottom surface region may be equal to or higher than $1.5 \times 10^{13}$ cm$^{-2}$.

In the above mentioned semiconductor device, the semiconductor substrate may be configured of Si, and the area density in the first bottom surface region and the area density in the second bottom surface region may be equal to or higher than $1.9 \times 10^{12}$ cm$^{-2}$.

According to this configuration, regions under the first trench and the second trench can be suppressed of being depleted. According to this, a high electric field being generated in a vicinity of each trench upon when the insulated gate type switching element is turned off can be suppressed.

The above mentioned semiconductor device can be manufactured by a following method. This method comprises: forming the first trench and the second trench in the front surface of the semiconductor substrate in the circumferential region and forming a gate trench in the front surface of the semiconductor substrate in the element region so that a taper angle of the first trench and a taper angle of the second trench are larger than a taper angle of the gate trench; forming a protective film on inner surfaces of the first trench, the second trench, and the gate trench; and implanting second conductivity type impurities to the semiconductor substrate. In the implantation, the second conductivity impurities pass through the protective film on a bottom surface of the gate trench so as to be implanted to the bottom surface of the gate trench, the second conductivity impurities are prevented from being implanted to the side surface of the gate trench by the protective film on the side surface of the gate trench, the second conductivity impurities pass through the protective film on the bottom surfaces of the first and second trenches so as to be implanted to the bottom surfaces of the first and second trenches, and the second conductivity impurities pass through the protective film on the side surfaces of the first and second trenches so as to be implanted to the side surfaces of the first and second trenches.

Accordingly, by making the taper angles to be different between the gate trench and the trenches of the circumferential region, the second conductivity type impurities can be implanted to the side surfaces of the first and second trenches while preventing the second conductivity type impurities from being implanted to the side surface of the gate trench.

The above mentioned semiconductor device also can be manufactured by a following method. This method comprises: forming the first trench and the second trench in the front surface of the semiconductor substrate in the circumferential region and forming a gate trench in the front surface of the semiconductor substrate in the element region; and implanting second conductivity type impurities to the front surface of the semiconductor substrate at an oblique angle in a state where a circumferential region mask having openings corresponding to the first trench and the second trench is provided on the front surface of the semiconductor substrate in the circumferential region and an element region mask thicker than the circumferential region mask and having an opening corresponding to the gate trench is provided on the front surface of the semiconductor substrate in the element region. In the implantation, the second conductivity impurities are implanted to the side surfaces of the first and second trenches and prevented from being implanted to the side surface of the gate trench by the element region mask.

Accordingly, by making the thickness of the mask covering the front surface to be different between the element region and the circumferential region, and performing the implantation of the second conductivity type impurities at the oblique angle relative to the trenches, the second conductivity type impurities can be implanted to the side surfaces of the first and second trenches while preventing the second conductivity type impurities from being implanted to the side surface of the gate trench.

The above mentioned semiconductor device also can be manufactured by a following method. This method comprises: forming the first trench and the second trench in the front surface of the semiconductor substrate in the circumferential region and forming the gate trench in the front surface of the semiconductor substrate in the element region so that a taper angle of the first trench and a taper angle of the second trench are larger than a taper angle of the gate trench; forming a protective film on inner surfaces of the first trench, the second trench, and the gate trench; removing the protective film located on the side surfaces and the bottom surfaces of the first and second trenches and on the bottom surface of the gate trench by anisotropic etching; and implanting second conductivity type impurities to the semiconductor substrate. In the implantation, the second conductivity type impurities are implanted to the side surfaces and the bottom surfaces of the first and second trenches and the bottom surface of the gate trench, and are prevented from being implanted to the side surface of the gate trench by the protective film.

Accordingly, by performing the anisotropic etching in the state where the taper angles differ between the gate trench and the trenches of the circumferential region, the protective film on the side surfaces of the first and second trenches can be removed while maintaining the protective film on the side surface of the gate trench. Thus, second conductivity type impurities can be implanted to the side surfaces of the first and second trenches while preventing the second conductivity type impurities from being implanted to the side surface of the gate trench.

DETAILED DESCRIPTION

Figure 1:
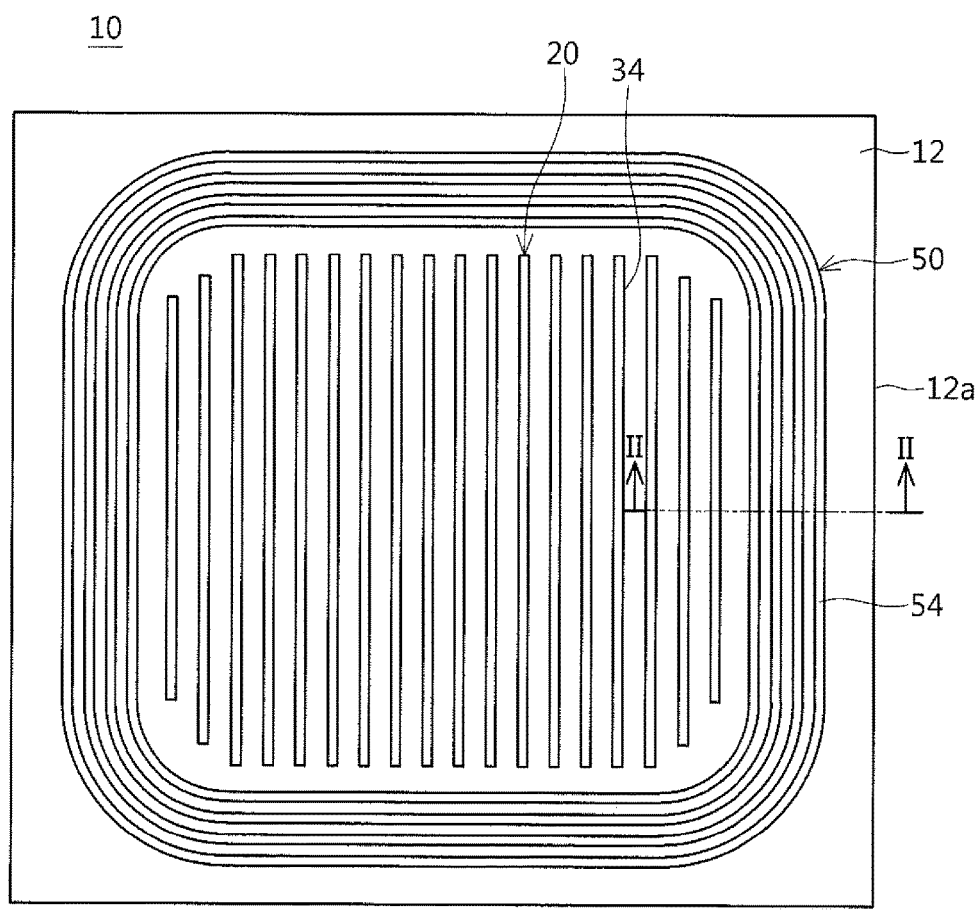
FIG. 1 is an upper view of a semiconductor device 10 (a diagram that omits depiction of an electrode and insulating films on a front surface)

A semiconductor device 10 shown in FIG. 1 comprises a semiconductor substrate 12 configured of SiC. The semiconductor substrate 12 comprises an element region 20 and a circumferential region 50. The element region 20 has a MOSFET provided therein. The circumferential region 50 is a region between the element region 20 and end faces 12a of the semiconductor substrate 12.

Figure 2:
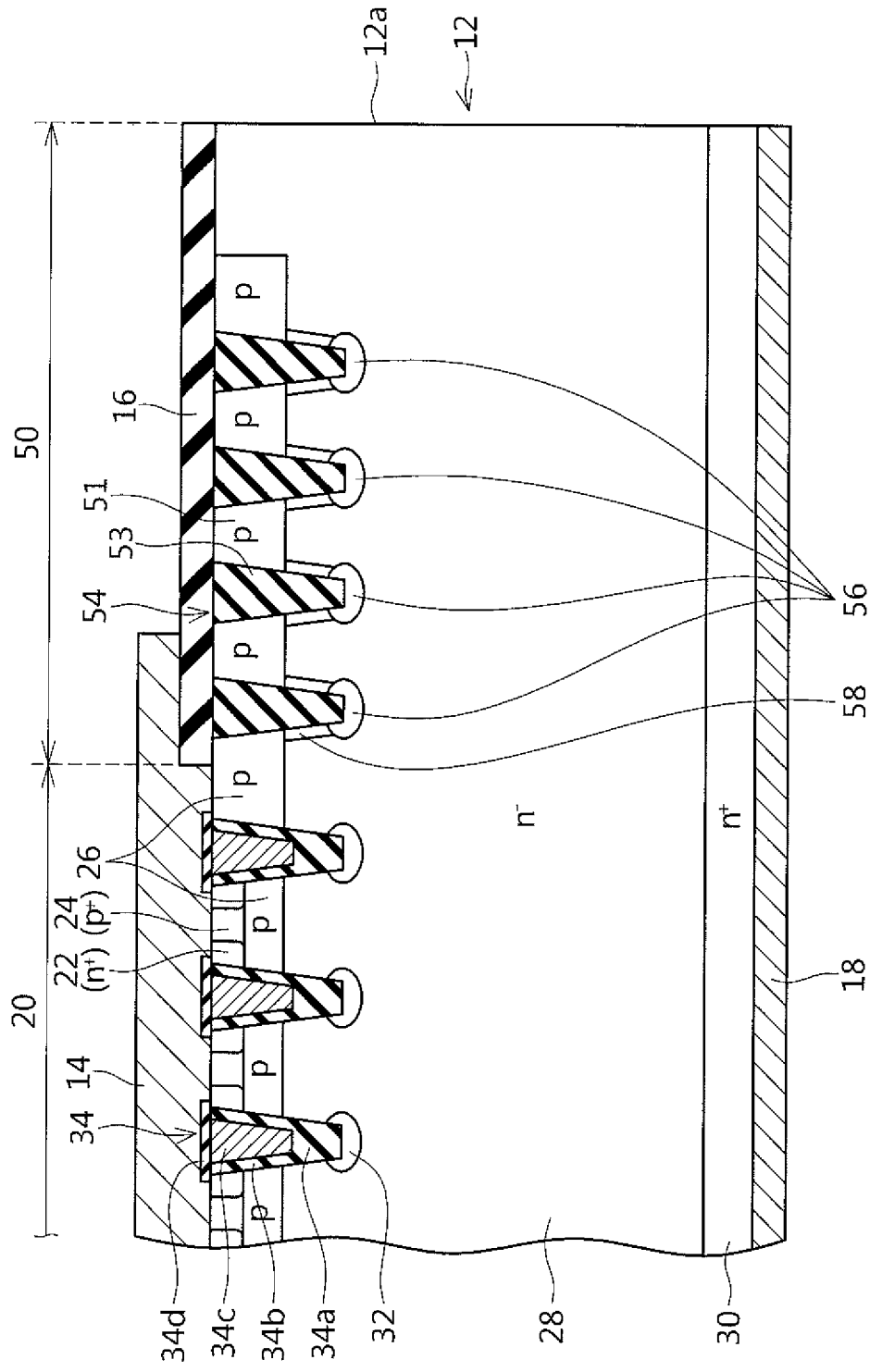
FIG. 2 is a vertical cross-sectional view of the semiconductor device 10 along a line II-II in FIG. 1.

As shown in FIG. 2, a front surface electrode 14 and an insulating film 16 are provided on a front surface of the semiconductor substrate 12. The insulating film 16 covers the front surface of the semiconductor substrate 12 within the circumferential region 50. The front surface electrode 14 is in contact with the semiconductor substrate 12 within the element region 20. In other words, a region under a contact region where the front surface electrode 14 is in contact with the semiconductor substrate 12 is the element region 20, and a region on an outer circumferential side (end face 12a side) than the contact region is the circumferential region 50. A rear surface electrode 18 is provided on a rear surface of the semiconductor substrate 12. The rear surface electrode 18 covers substantially an entirety of the rear surface of the semiconductor substrate 12.

Source regions 22, body contact regions 24, a body region 26, a drift region 28, a drain region 30, p-type floating regions 32, and gate trenches 34 are provided in the element region 20.

The source regions 22 are n-type regions containing n-type impurities at a high concentration. The source regions 22 are provided within ranges that are exposed on an upper surface of the semiconductor substrate 12. The source regions 22 make an ohmic connection to the front surface electrode 14.

The body contact regions 24 are p-type regions containing p-type impurities at a high concentration. The body contact regions 24 are provided to be exposed on the upper surface of the semiconductor substrate 12 at a position where the source regions 22 are not provided. The body contact regions 24 make an ohmic connection to the front surface electrode 14.

The body region 26 is a p-type region containing p-type impurities at a low concentration. The p-type impurity concentration of the body region 26 is lower than the p-type impurity concentration of the body contact regions 24. The body region 26 is provided under the source regions 22 and the body contact regions 24, and is in contact with these regions.

The drift region 28 is an n-type region containing n-type impurities at a low concentration. The n-type impurity concentration of the drift region 28 is lower than the n-type impurity concentration of the source regions 22. The drift region 28 is provided under the body region 26. The drift region 28 is in contact with the body region 26, and is separated from the source regions 22 by the body region 26.

The drain region 30 is an n-type region containing n-type impurities at a high concentration. The n-type impurity concentration of the drain region 30 is higher than the n-type impurity concentration of the drift region 28. The drain region 30 is provided under the drift region 28. The drain region 30 is in contact with the drift region 28, and is separated from the body region 26 by the drift region 28. The drain region 30 is provided in a range that is exposed to a lower surface of the semiconductor substrate 12. The drain region 30 makes an ohmic connection to the rear surface electrode 18.

As shown in FIGS. 1 and 2, the plurality of gate trenches 34 is provided on the upper surface of the semiconductor substrate 12 within the element region 20. Each of the gate trenches 34 extends straight and parallel to each other in the front surface of the semiconductor substrate 12. Each of the gate trenches 34 is configured to penetrate its corresponding source region 22 and the body region 26, and reach the drift region 28. In each of the gate trenches 34, a bottom insulating layer 34a, a gate insulating film 34b, and a gate electrode 34c are provided. The bottom insulating layers 34a are thick insulating layers provided respectively at bottom portions of the gate trenches 34. Side surfaces of each gate trench 34 above the bottom insulating layer 34a are covered by the gate insulating film 34b. The gate electrodes 34c are provided inside the gate trenches 34 above the bottom insulating layers 34a. The gate electrodes 34c extend from the front surface of the semiconductor substrate 12 to positions deeper than the body region 26. Each gate electrode 34c faces the corresponding source regions 22, the body region 26, and the drift region 28 via the gate insulating film 34b. The gate electrodes 34c are insulated from the semiconductor substrate 12 by the gate insulating films 34b and bottom insulating layers 34a. An upper surface of each gate electrode 34c is covered by an insulating layer 34d. The gate electrodes 34c are insulated from the front surface electrode 14 by the insulating layers 34d.

The p-type floating regions 32 are provided in ranges within the semiconductor substrate 12 that are respectively in contact with bottom surfaces of the gate trenches 34.

Peripheries of the p-type floating regions 32 are surrounded by the drift region 28. The p-type floating regions 32 are separated from each other by the drift region 28.

A p-type front surface region 51 is provided in a range exposed on the front surface of the semiconductor substrate 12 within the circumferential region 50. The front surface region 51 extends to a substantially same depth as the body region 26. The aforementioned drift region 28 and drain region 30 extend into the circumferential region 50. The drift region 28 and the drain region 30 extend to the end faces 12a of the semiconductor substrate 12. The drift region 28 is in contact with the front surface region 51 from underneath.

A plurality of circumferential trenches 54 is provided on the upper surface of the semiconductor substrate 12 in the circumferential region 50. Each of the circumferential trenches 54 is configured to penetrate the front surface region 51 and reach the drift region 28. An insulating layer 53 is provided in each of the circumferential trenches 54. As shown in FIG. 1, the circumferential trenches 54 are provided in ring shapes that circumscribe the element region 20 when the semiconductor substrate 12 is seen from above. The circumferential trenches 54 are provided with intervals in between each other.

P-type bottom surface regions 56 are provided in ranges within the semiconductor substrate 12 that are respectively in contact with bottom surfaces of the circumferential trenches 54. The bottom surface regions 56 are respectively provided along the circumferential trenches 54 so as to cover entireties of the bottom surfaces of the circumferential trenches 54.

P-type side-surface regions 58 are provided in ranges making contact with side surfaces of each circumferential trench 54. The side-surface regions 58 cover the side surfaces of the respective circumferential trenches 54 that are positioned between the bottom surface regions 56 and the front surface region 51. Thus, the bottom surface regions 56 are connected to the front surface region 51 by the side-surface regions 58.

Figure 3:
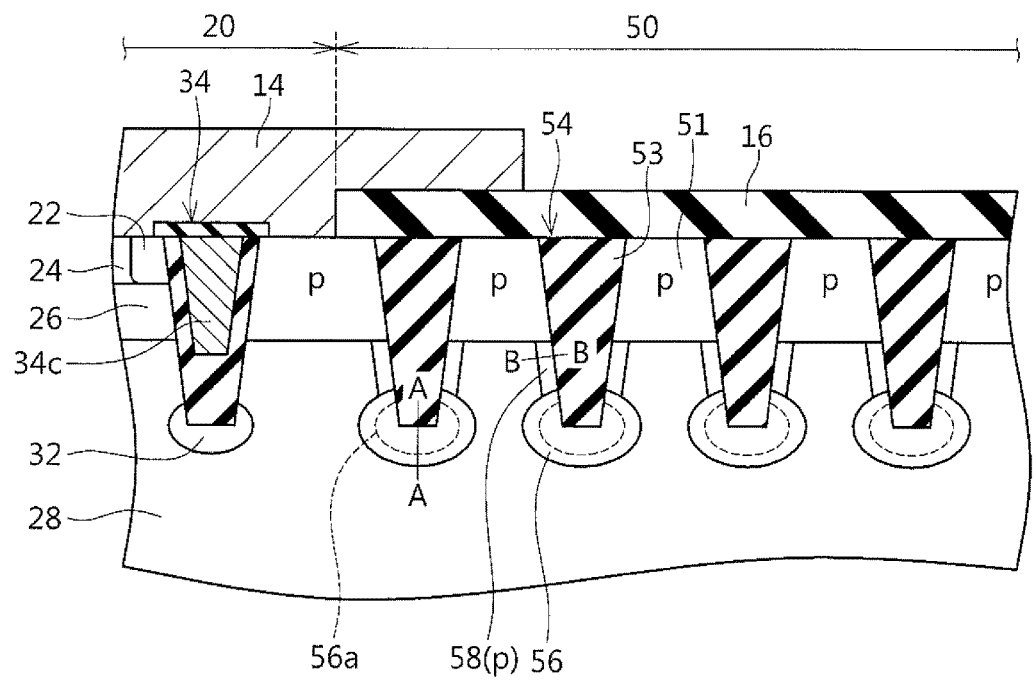
FIG. 3 is an enlarged view of a circumferential region 50.

FIG. 3 shows an enlarged view of the circumferential trenches 54 in FIG. 2. Each of the bottom surface regions 56 has a relatively high p-type impurity concentration. On the other hand, each of the side-surface regions 58 has a p-type impurity concentration that is lower than that of the bottom surface regions 56. Further, a p-type impurity area density within the bottom surface regions 56 is higher than a p-type impurity area density within the side-surface regions 58. Here, as shown along a line A-A in FIG. 3, the p-type impurity area density in the bottom surface regions 56 is of a value that integrates the p-type impurity concentration in the bottom surface regions 56 along a thickness direction of the semiconductor substrate 12. Further, as shown along a line B-B in FIG. 3, the p-type impurity area density of the side-surface regions 58 is of a value that integrates the p-type impurity concentration in the side-surface regions 58 along a direction perpendicular to the side surfaces of the circumferential trenches 54.

Next, an operation of the semiconductor device 10 will be described. Upon operating the semiconductor device 10, a voltage that brings the rear surface electrode 18 to be charged positively is applied between the rear surface electrode 18 and the front surface electrode 14. Moreover, the MOSFET in the element region 20 turns on by a gate-on voltage being applied to the gate electrodes 34c. That is, channels are generated in the body region 26 at positions facing the gate electrodes 34c, and electrons flow from the front surface electrode 14 toward the rear surface electrode 18 through the source regions 22, the channels, the drift region 28, and the drain region 30.

When the application of the gate-on voltage to the gate electrode 34c is stopped, the channels disappear and the MOSFET turns off. When the MOSFET turns off, a depletion layer extends from a pn junction at a boundary between the body region 26 and the drift region 28 into the drift region 28. When the depletion layer reaches the p-type floating regions 32 in the element region 20, the depletion layer extends from the p-type floating regions 32 into the drift region 28 as well. Due to this, the drift region 28 between two p-type floating regions 32 is effectively depleted. Due to this, a high voltage resistance in the element region 20 is thereby facilitated.

Further, the aforementioned bottom surface regions 56, side-surface regions 58, and front surface region 51 are p-type regions that are arranged continuously with the body region 26 in the element region 20. Thus, when the application of the gate-on voltage is stopped, the depletion layer extends from the bottom surface regions 56, side-surface regions 58, and front surface region 51 into the drift region 28 of the circumferential region 50. Accordingly, in the semiconductor device 10 of the present embodiment, the depletion layer extends substantially simultaneously in the circumferential region 50 within the drift region 28 from the respective p-type regions (that is, bottom surface regions 56, side-surface regions 58, and front surface region 51). Due to this, the expansion of the depletion layer in the circumferential region 50 takes place extremely fast.

Further, the depletion layer expands also into the respective p-type regions (that is, bottom surface regions 56, side-surface regions 58, and front surface region 51) in the circumferential region 50. At this occasion, each of the side-surface regions 58 is depleted over its entirety. Contrary to this, although each of the bottom surface regions 56 and the front surface region 51 are partially depleted, their entireties are not depleted. This is because the p-type impurity area density (area density along a direction of the line B-B) in the side-surface regions 58 is lower than the p-type impurity area density (area density along a direction of the line A-A) in the bottom surface regions 56 and the p-type impurity area density (area density along the thickness direction of the semiconductor substrate 12) in the front surface region 51. Accordingly, when the side-surface regions 58 are depleted, the bottom surface regions 56 and the front surface region 51 are separated from each other by the depletion layer. Due to this, a potential difference is generated between each bottom surface region 56 and its corresponding portion of the front surface region 51. Due to this, the potential can be distributed evenly within the circumferential region 50. Further, within the bottom surface regions 56, the depletion layer does not extend into regions 56a in FIG. 3. That is, the regions 56a are not depleted. As shown, the bottom surfaces of the circumferential trenches 54 are covered by the regions 56a. Accordingly, since semiconductor regions in vicinities of the bottom surfaces of the circumferential trenches 54 are not be depleted, a concentration of an electric field in the vicinities of the bottom surfaces of the circumferential trenches 54 can be suppressed.

As described above, in the semiconductor device 10, the depletion layer can be expanded within the circumferential region 50 quickly, due to the depletion layer expanding from the respective p-type regions (that is, bottom surface regions 56, side-surface regions 58, and front surface region 51) in the circumferential region 50. Further, since the bottom surface regions 56 and the front surface region 51 are separated from each other when the side-surface regions 58 are depleted, the potential can be shared between the bottom surface regions 56 and the front surface region 51. Further, also in the event where the depletion layer expands within the circumferential region 50, due to the presence of the undepleted p-type regions 56a under the circumferential trenches 54, the concentration of the electric field at lower ends of the circumferential trenches 54 can be suppressed. Due to this, the semiconductor device 10 has a high voltage resistance.

Notably, in a case of completely depleting the side-surface regions 58 in their thickness direction (direction along the line B-B), the area density (area density along the direction of the line B-B) of the side-surface regions 58 is preferably less than $3.2 \times 10^{13}$ cm$^{-2}$. In a region with an area density higher than this value, a voltage required for its depletion would exceed an avalanche voltage resistance, thus it cannot be depleted. If the area density is lower than this value, it is possible to deplete the side-surface regions 58 over their entireties in the thickness direction by adjusting the voltage, and the aforementioned effect can be achieved. Notably, if the semiconductor substrate 12 is Si, the side-surface regions 58 can be depleted over their entireties in the thickness direction by setting the area density to be less than $2.0 \times 10^{12}$ cm$^{-2}$. Notably, so long as the bottom surface regions 56 and the front surface region 51 can be separated by the depletion layer, the area density may be low only within a partial region within each side-surface region 58.

Figure 4:
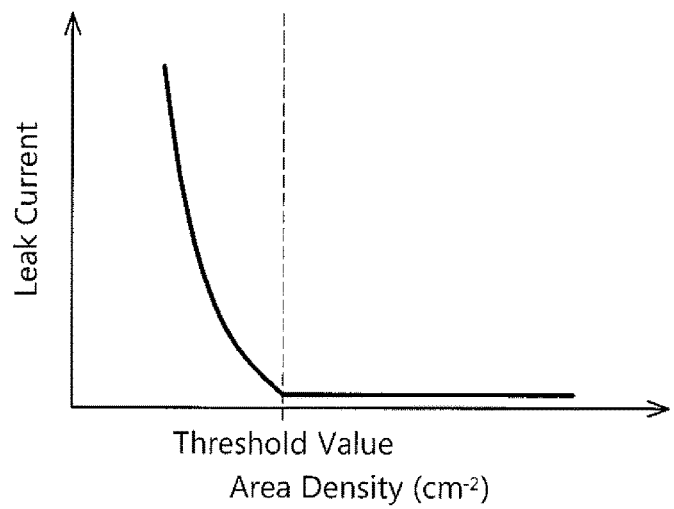
FIG. 4 is a graph showing a relationship between an area density and a leak current.

Further, in a case of not depleting the regions 56a including the bottom surfaces of the circumferential trenches 54, the area density (area density along the direction of the line A-A) of the bottom surface regions 56 is preferably equal to or higher than $1.5 \times 10^{13}$ cm$^{-2}$. FIG. 4 is a graph showing a relationship between the area density of the bottom surface regions 56 and a leak current that flows in vicinities of the circumferential trenches 54. With an application voltage at practical level, as shown, the leak current can be minimized when the area density is equal to or higher than a predetermined threshold. In a case where the semiconductor substrate 12 is configured of SiC, this threshold is $1.5 \times 10^{13}$ cm$^{-2}$. Thus, the area density of the bottom surface regions 56 is preferably $1.5 \times 10^{13}$ cm$^{-2}$. However, in a case of more surely preventing the depletion of the regions 56a, the area density of the bottom surface regions 56 may be set to equal to or higher than $3.2 \times 10^{13}$ cm$^{-2}$. Further, in the case where the semiconductor substrate 12 is configured of Si, the threshold is $1.9 \times 10^{12}$ cm$^{-2}$. Thus, the area density of the bottom surface regions 56 is preferably $1.9 \times 10^{12}$ cm$^{-2}$. However, in the case of more surely preventing the depletion of the regions 56a, the area density of the bottom surface regions 56 may be set to equal to or higher than $2.0 \times 10^{12}$ cm$^{-2}$.

Next, manufacturing methods of the semiconductor device 10 will be described. Notably, the manufacturing methods disclosed in this description are characteristic in their process for forming the p-type floating regions 32, the bottom surface regions 56, and the side-surface regions 58, thus hereinbelow, the explanation will primarily be given on the process of forming them. The description proposes first to fourth manufacturing methods.

(First Manufacturing Method)

Figure 5:
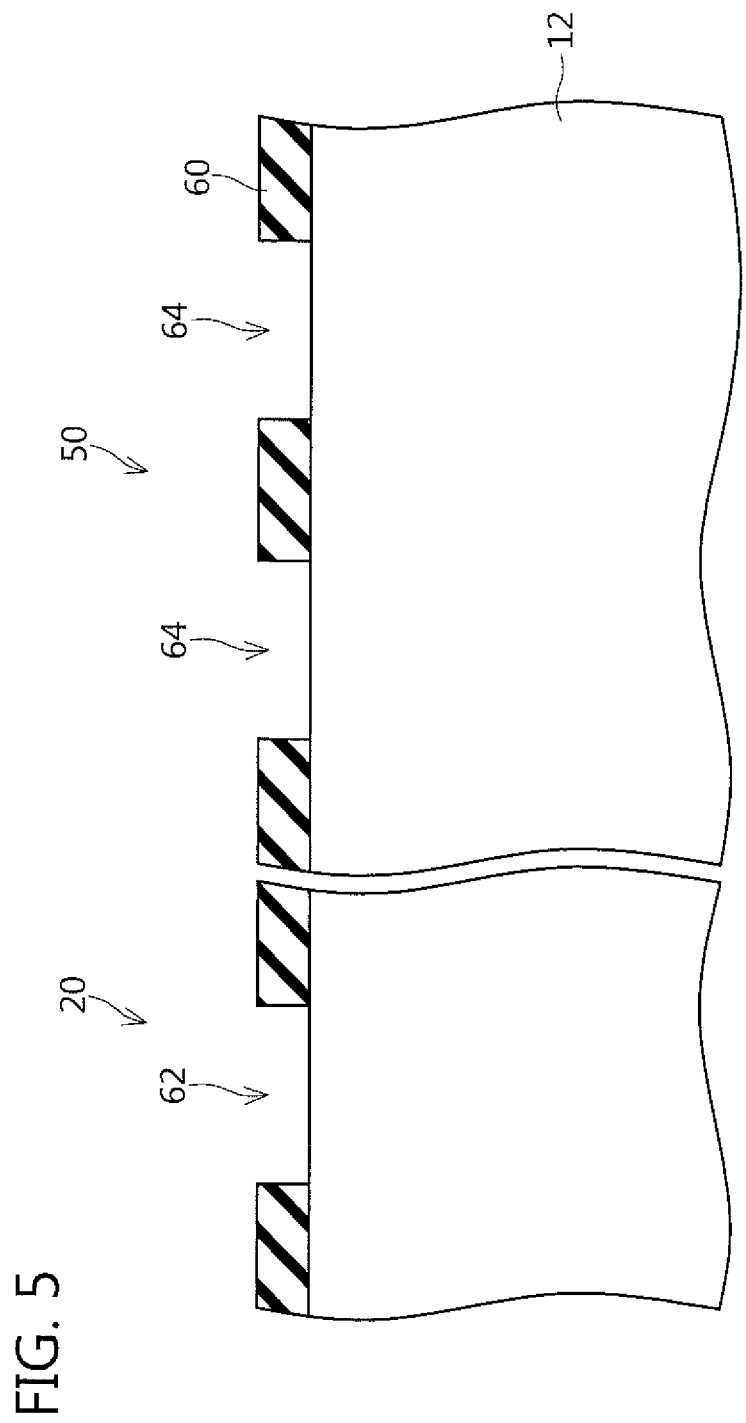
FIG. 5 is an explanatory diagram on a first manufacturing method.
Figure 6:
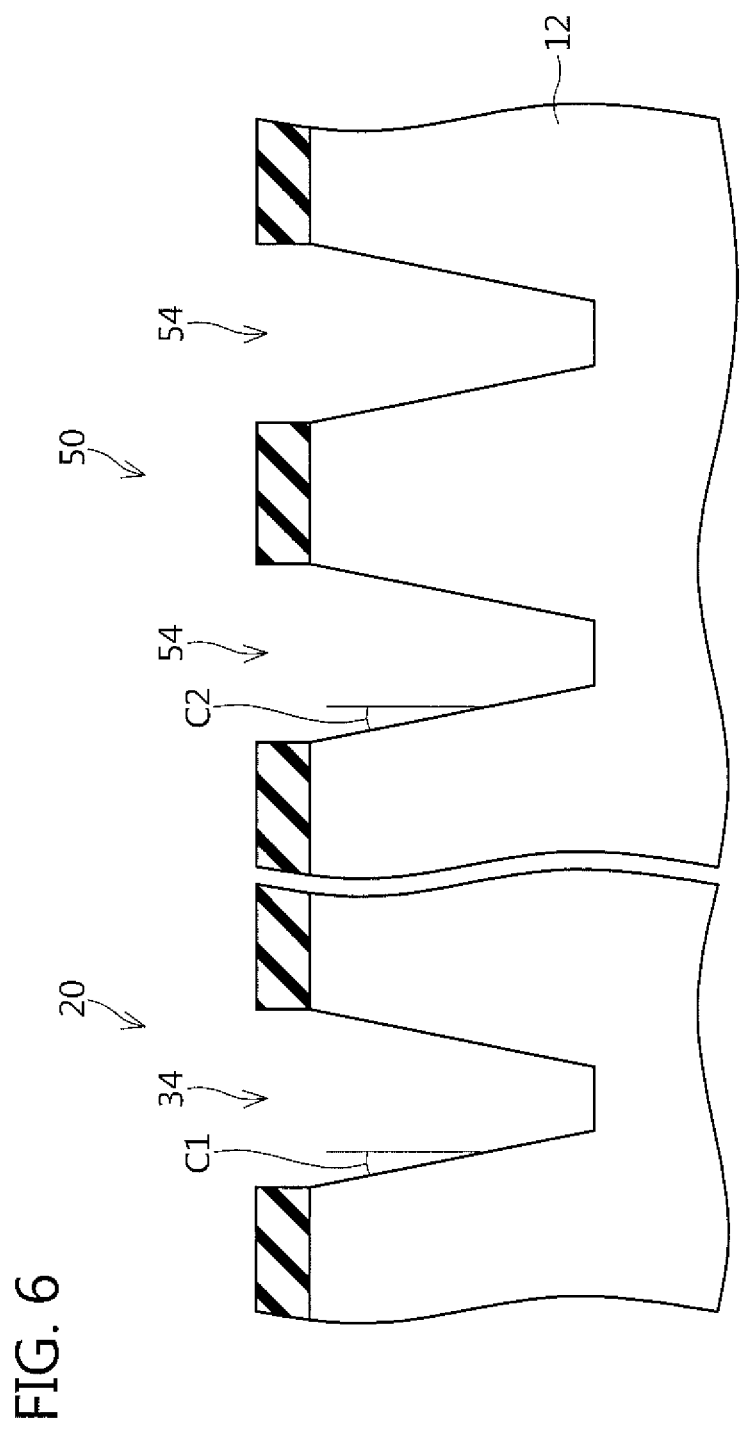
FIG. 6 is an explanatory diagram on the first manufacturing method.
Figure 7:
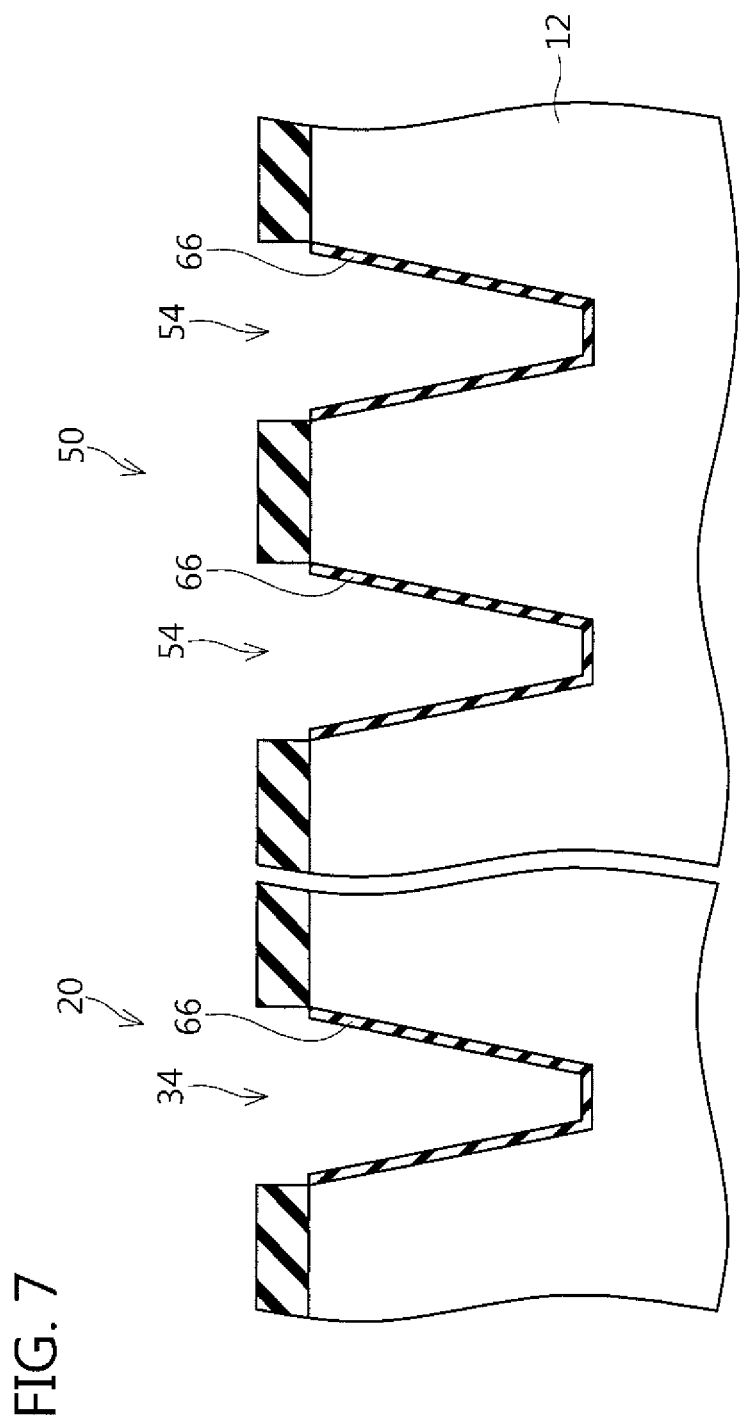
FIG. 7 is an explanatory diagram on the first manufacturing method.

In a first manufacturing method, firstly, as shown in FIG. 5, a mask 60 (e.g., an oxide film) is formed on the front surface of the semiconductor substrate 12. Here, the mask 60 is formed so that openings 62 are located at positions corresponding to the gate trenches 34, and openings 64 are located at positions corresponding to the circumferential trenches 54. A width of the openings 62 and a width of the openings 64 are substantially equal. Next, the semiconductor substrate 12 within the openings 62, 64 is etched by an anisotropic etching. At this occasion, it is preferable to use an etch-processing pressure that is equal to or higher than 100 mT. According to this, as shown in FIG. 6, the gate trenches 34 and the circumferential trenches 54 are formed. At this occasion, side surfaces of the gate trenches 34 and the circumferential trenches 54 have a form that is inclined in a tapered shape. Since the width of the openings 62 and the width of the openings 64 are substantially the same, a taper angle C1 of the gate trenches 34 and a taper angle C2 of the circumferential trenches 54 become substantially equal. Here, the taper angles mean inclined angles of the side surfaces of the trenches (angles with respect to the thickness direction of the semiconductor substrate 12). Next, as shown in FIG. 7, protective films 66 (oxide films) are formed on inner surfaces of the gate trenches 34 and the circumferential trenches 54 by a CVD method or a thermal oxidation method.

Figure 8:
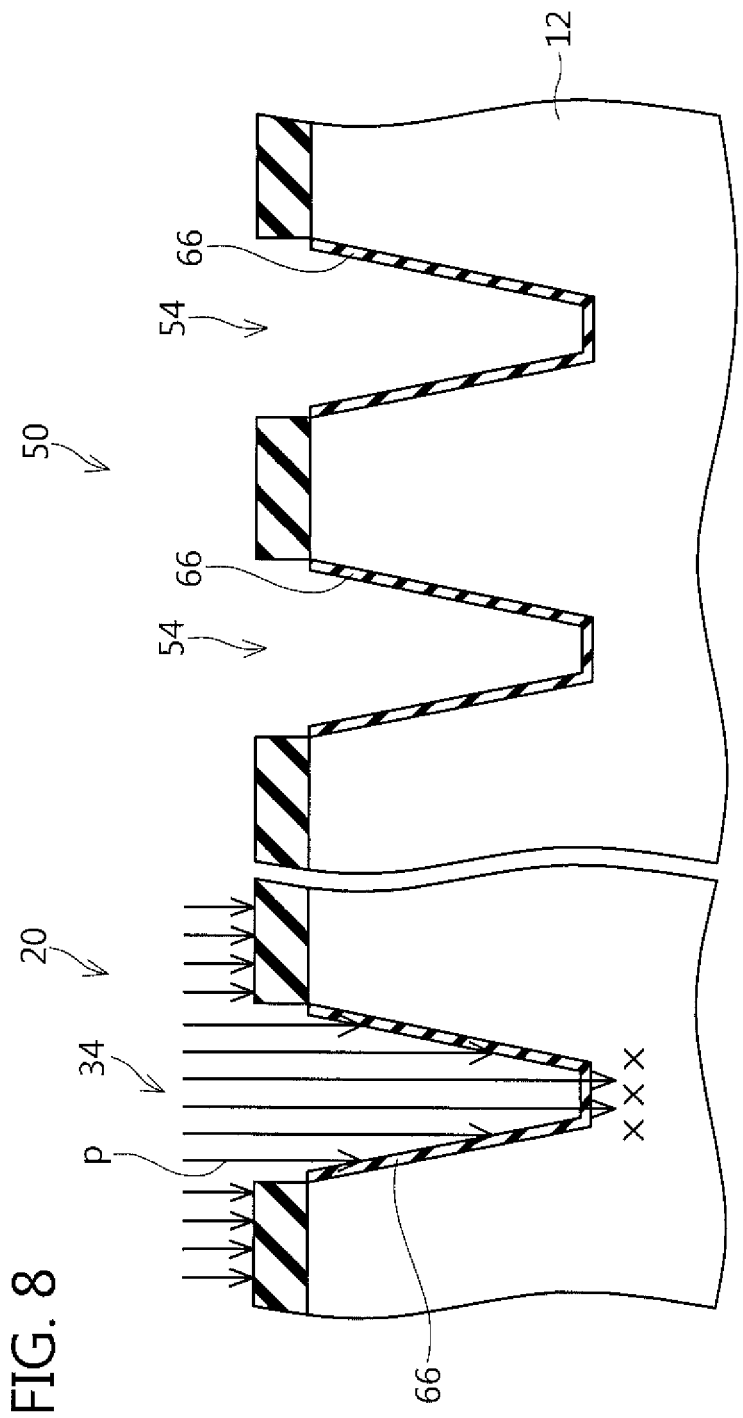
FIG. 8 is an explanatory diagram on the first manufacturing method.

Next, p-type impurities are implanted into the element region 20 as shown in FIG. 8 in a state where an entirety of the circumferential region 50 is covered by a mask that is not shown. Here, the p-type impurities are implanted substantially perpendicular to the bottom surfaces of the gate trenches 34. Further, an implantation energy of the p-type impurities is adjusted so that the p-type impurities penetrate through the protective films 66 on the bottom surfaces of the gate trenches 34 but do not penetrate through the protective films 66 on the side surfaces of the gate trenches 34. Due to this, the p-type impurities are implanted to the bottom surfaces of the gate trenches 34 whereas on the other hand the p-type impurities are not implanted to the side surfaces of the gate trenches 34.

Figure 9:
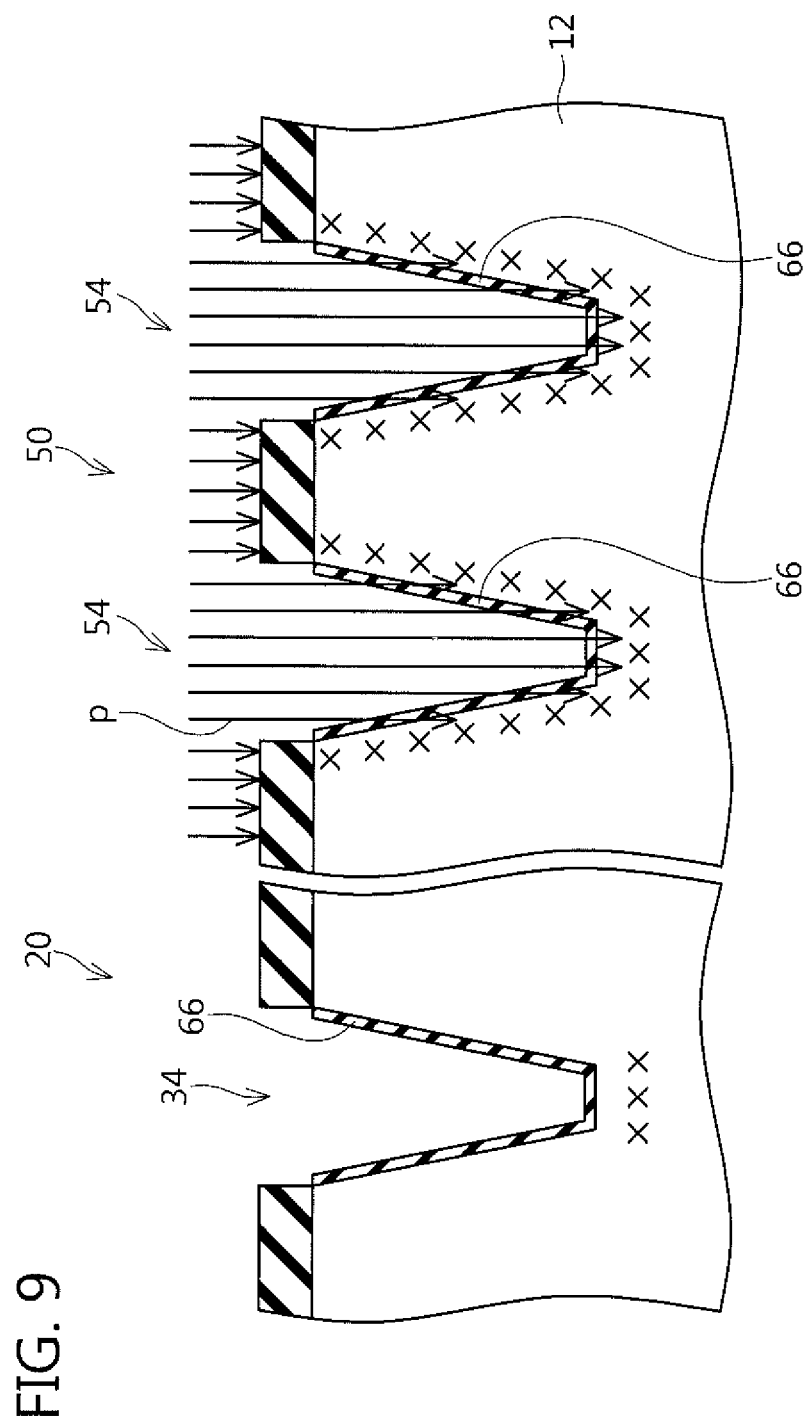
FIG. 9 is an explanatory diagram on the first manufacturing method.

Next, p-type impurities are implanted into the circumferential region 50 as shown in FIG. 9 in a state where an entirety of the element region 20 is covered by a mask that is not shown. Here, the p-type impurities are implanted substantially perpendicular to the bottom surfaces of the circumferential trenches 54. Further, an implantation energy of the p-type impurities is adjusted so that the p-type impurities penetrate through the protective films 66 on the bottom surfaces of the circumferential trenches 54 and also penetrate through the protective film 66 on the side surfaces of the circumferential trenches 54. Due to this, the p-type impurities are implanted to the bottom surfaces of the circumferential trenches 54 as well as to the side surfaces of the circumferential trenches 54. Thereafter, the p-type floating regions 32, the bottom surface regions 56, and the side-surface regions 58 are formed by activating the implanted p-type impurities by a heat treatment or the like. Then, the semiconductor device 10 as shown in FIG. 1 is completed by forming the necessary regions.

(Second Manufacturing Method)

Figure 10:
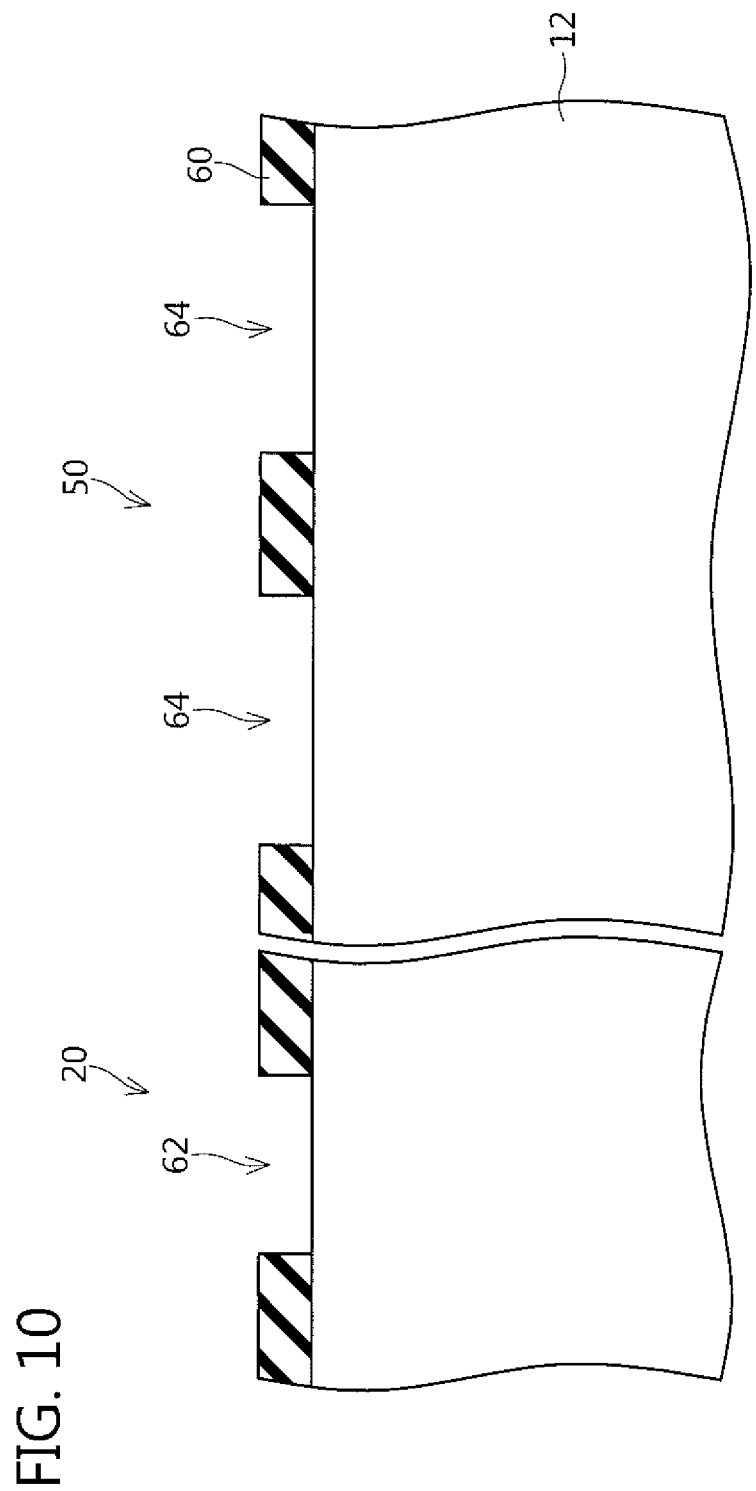
FIG. 10 is an explanatory diagram on a second manufacturing method.
Figure 11:
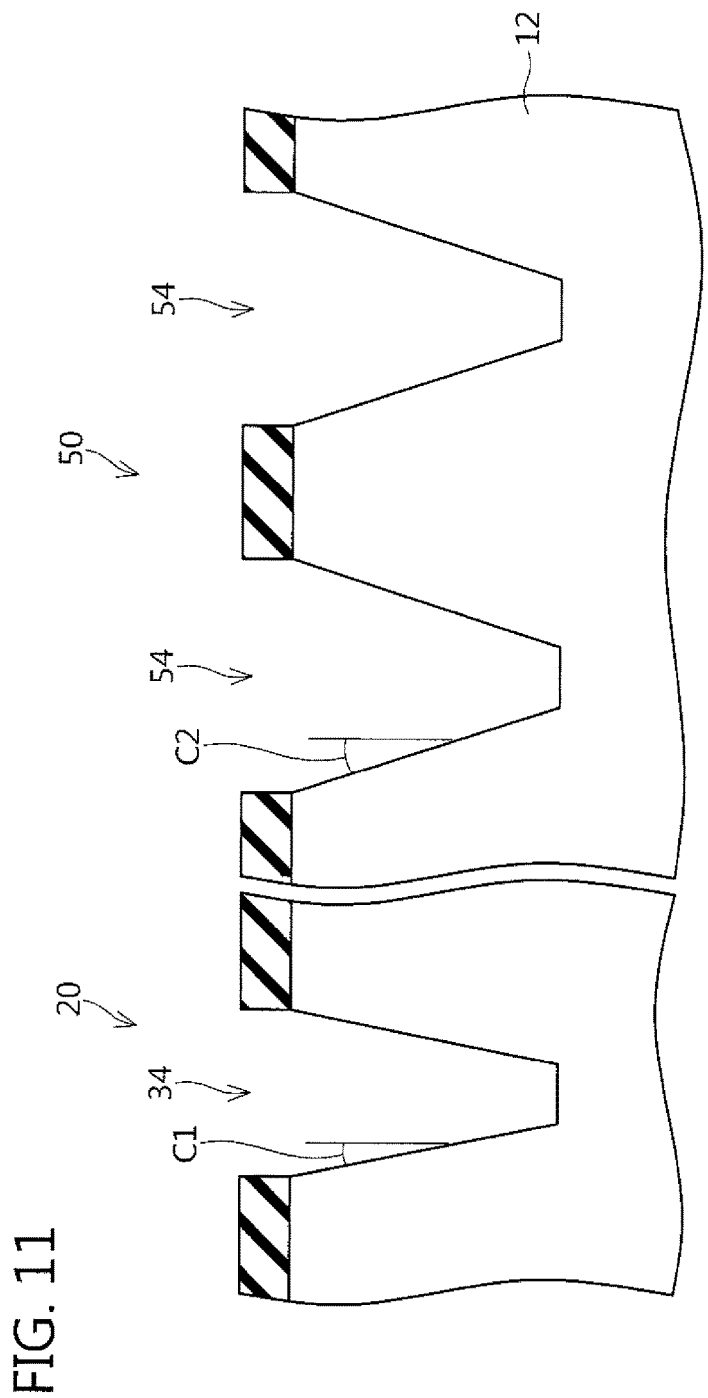
FIG. 11 is an explanatory diagram on the second manufacturing method.
Figure 12:
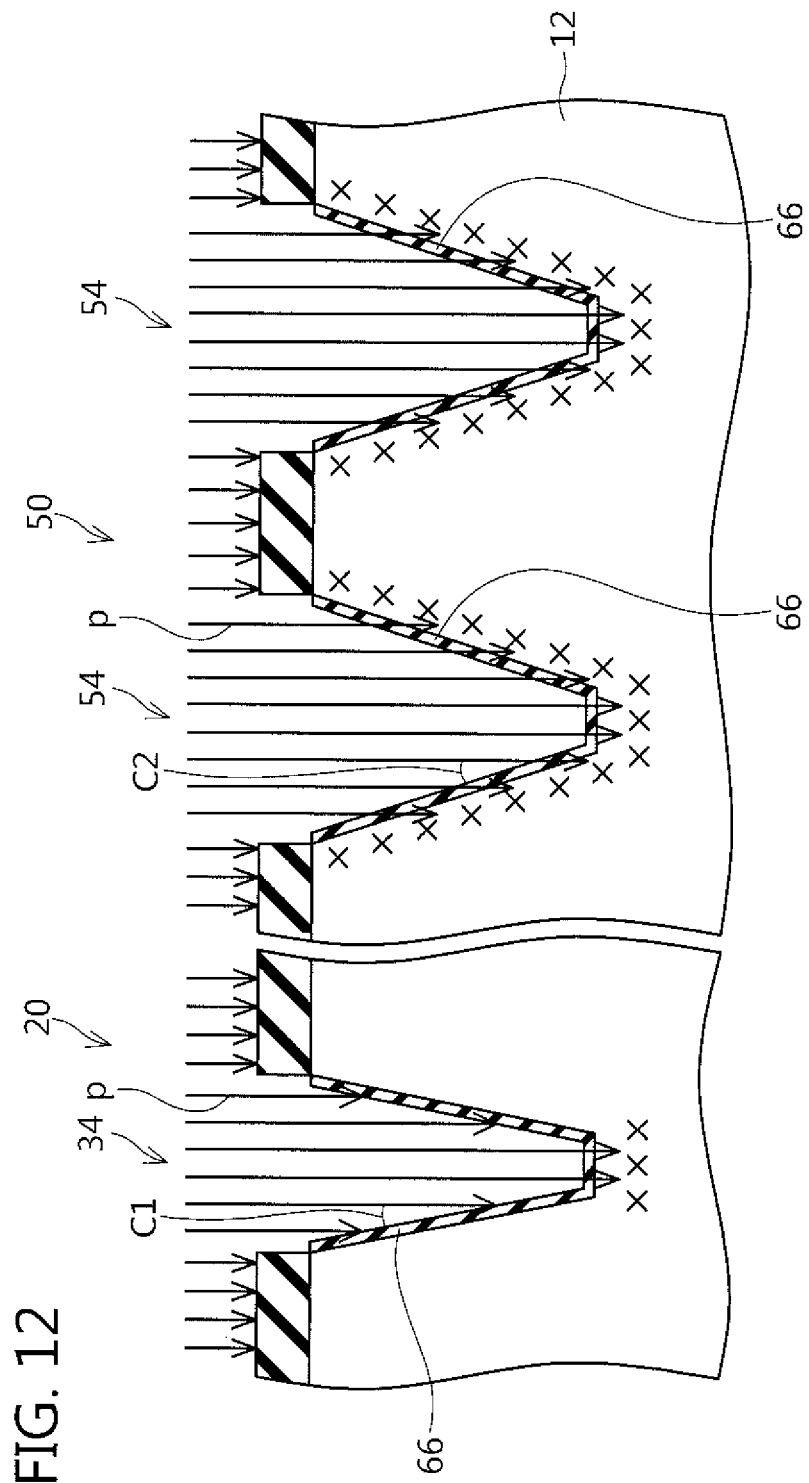
FIG. 12 is an explanatory diagram on the second manufacturing method.

In a second manufacturing method, firstly, as shown in FIG. 10, a mask 60 is formed on the front surface of the semiconductor substrate 12. Here, the mask 60 is formed so that a width of openings 64 corresponding to the circumferential trenches 54 becomes wider than a width of openings 62 corresponding to the gate trenches 34. For example, the width of the openings 64 may be about 1.5 times the width of the openings 62. Next, the semiconductor substrate 12 within the openings 62, 64 is etched by an anisotropic etching. At this occasion, it is preferable to use an etch-processing pressure that is equal to or higher than 100 mT. According to this, as shown in FIG. 11, the gate trenches 34 and the circumferential trenches 54 are formed. At this occasion, a taper angle C2 of the circumferential trenches 54 becomes larger than a taper angle C1 of the gate trenches 34 due to the width of the openings 64 being wider than the width of the openings 62. That is, an inclined angle of side surfaces of the circumferential trenches 54 becomes larger. For example, the taper angle C1 shown in FIG. 11 may be less than 2°, and the taper angle C2 thereof may be equal to or greater than 2°. Next, as shown in FIG. 12, protective films 66 (oxide films) are provided on inner surfaces of the gate trenches 34 and the circumferential trenches 54. Here, a thickness of the protective films 66 is set to about 75 nm.

Next, as shown in FIG. 12, the p-type impurities are implanted to both the element region 20 and the circumferential region 50. Here, the p-type impurities are implanted substantially perpendicular to the bottom surfaces of the respective trenches. Here, an implantation energy of the p-type impurities is adjusted so that the p-type impurities do not penetrate through the protective films 66 on the side surfaces of the gate trenches 34 but penetrate through the other protective films 66. Since the taper angle C2 of the circumferential trenches 54 is larger than the taper angle C1 of the gate trenches 34, an implantation angle C2 relative to the side surfaces of the circumferential trenches 54 is larger than an implantation angle C1 relative to the side surfaces of the gate trenches 34. Due to this, the implantation energy for the p-type impurities can be set so that the p-type impurities are implanted to the side surfaces of the circumferential trenches 54 but are not implanted to the side surfaces of the gate trenches 34. Thereafter, the p-type floating regions 32, the bottom surface regions 56, and the side-surface regions 58 are formed by activating the implanted p-type impurities by a heat treatment or the like. Then, the semiconductor device 10 is completed by forming the necessary regions.

(Third Manufacturing Method)

Figure 13:
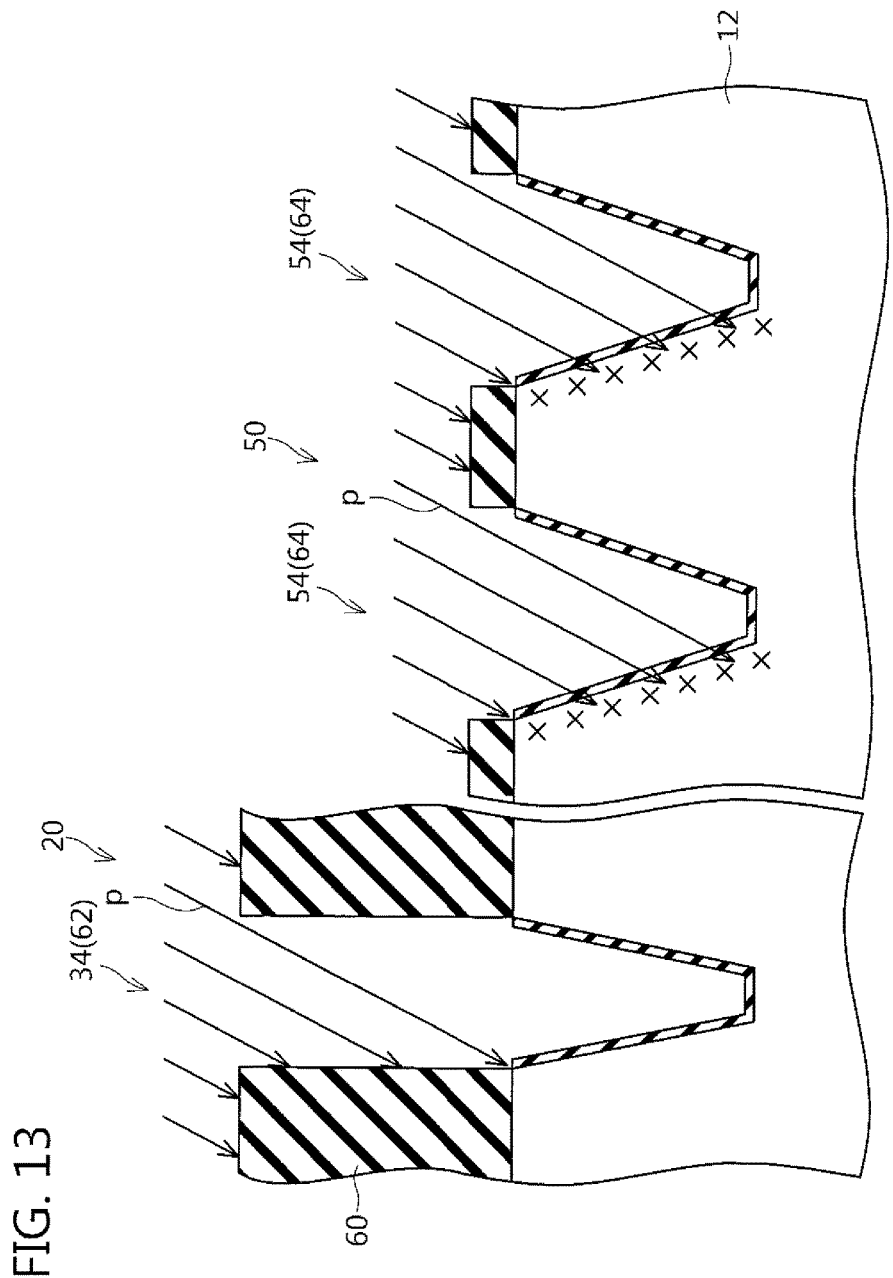
FIG. 13 is an explanatory diagram on a third manufacturing method.

In a third manufacturing method, firstly, as shown in FIG. 13, a mask 60 is formed on the front surface of the semiconductor substrate 12. Here, the mask 60 is formed so that a width of openings 64 corresponding to the circumferential trenches 54 becomes wider than a width of openings 62 corresponding to the gate trenches 34. Further, the mask 60 is made thicker within the element region 20 than in the circumferential region 50. Next, as shown in FIG. 13, the gate trenches 34 and the circumferential trenches 54 are formed by an anisotropic etching. Here, similar to the second manufacturing method, the width of the circumferential trenches 54 becomes wider than the width of the gate trenches 34. Next, protective films 66 are formed on inner surfaces of the respective trenches.

Next, as shown in FIG. 13, the p-type impurities are implanted. Here, the p-type impurities are implanted so that an implantation direction relative to the semiconductor substrate 12 in a cross section through the trenches becomes oblique. In the circumferential region 50, the p-type impurities are implanted to the side surfaces of the circumferential trenches 54. On the other hand, in the element region 20, since the mask 60 is thick and the width of the gate trenches 34 is narrow, the p-type impurities are blocked by the mask 60 and do not reach the gate trenches 34. Accordingly, the p-type impurities are implanted only to the side surfaces of the circumferential trenches 54. Thereafter, the p-type impurities are implanted to the opposite side surfaces of the circumferential trenches 54 by changing the angle. Then, the angle is further changed, and the p-type impurities are implanted to the bottom surfaces of the respective trenches. Thereafter, the p-type floating regions 32, the bottom surface regions 56, and the side-surface regions 58 are formed by activating the implanted p-type impurities by a heat treatment or the like. Then, the semiconductor device 10 is completed by forming the necessary regions.

Notably, in the third manufacturing method, the widths of the gate trenches 34 and the circumferential trenches 54 may be set equal. According to such a configuration as well, the difference in the thickness in the mask 60 can suppress the implantation of the p-type impurities to the side surfaces of the gate trenches 34.

(Fourth Manufacturing Method)

In a fourth manufacturing method, the structure of FIG. 11 is formed similar to the second manufacturing method. Then, protective films 66 are formed on inner surfaces of the respective trenches. Here, nitride films are used as the protective film 66. Next, the protective film 66 is etched by an anisotropic etching, in which the etching progresses in the thickness direction of the semiconductor substrate 12. The protective films 66 on the bottom surfaces of the respective trenches are etched perpendicularly, thus are removed easily. Further, since a taper angle C2 of the side surfaces of the circumferential trenches 54 is larger than a taper angle C1 of the side surfaces of the gate trenches 34, the protective films 66 on the side surfaces of the circumferential trenches 54 are more easily etched. Here, an etching condition is set so that the protective films 66 on the side surfaces of the circumferential trenches 54 are removed and the protective films 66 remain on the side surfaces of the gate trenches 34. Due to this, the protective films 66 remain only on the side surfaces of the gate trenches 34 as shown in FIG. 14.

Figure 14:
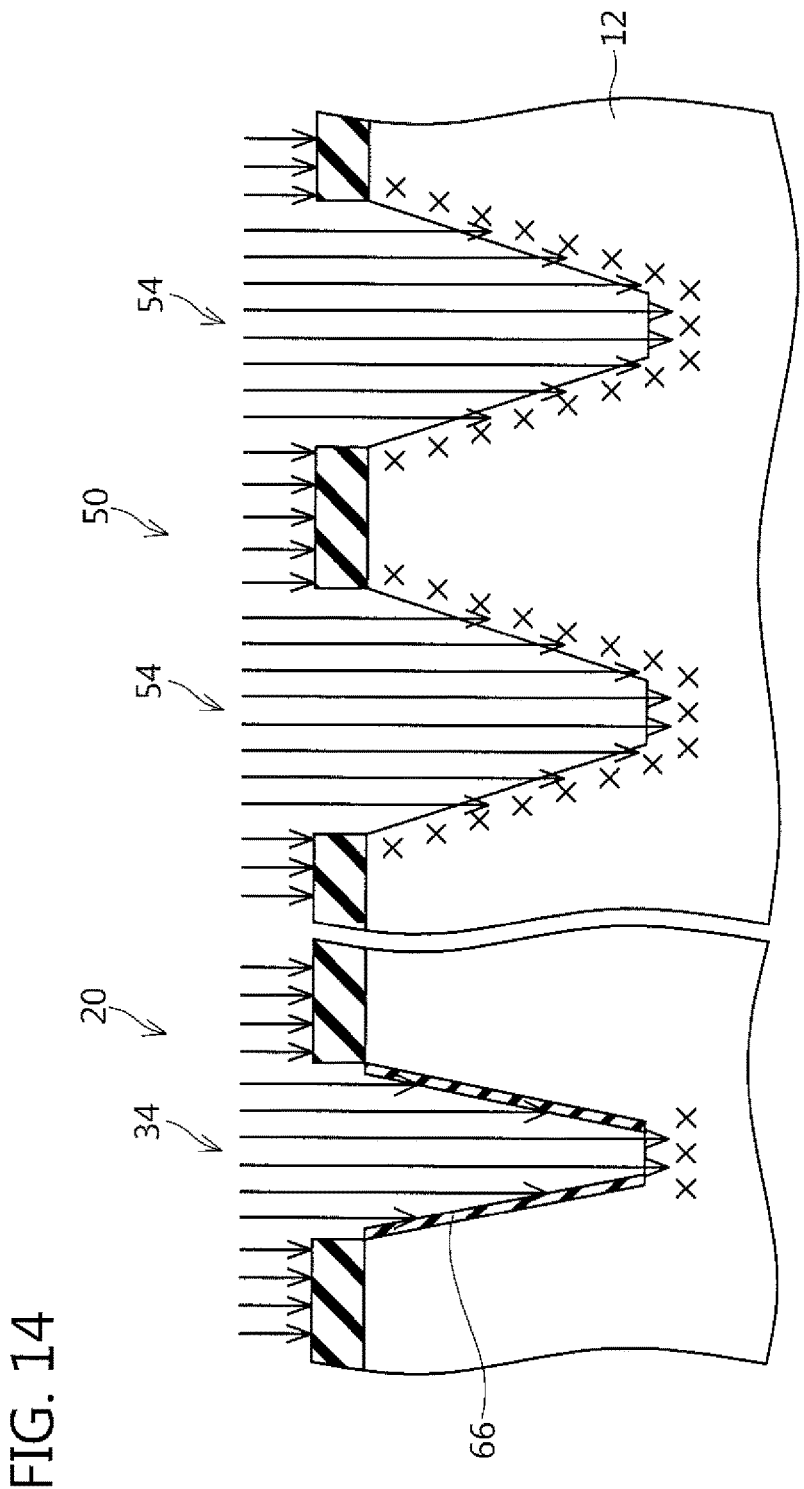
FIG. 14 is an explanatory diagram on a fourth manufacturing method.

Next, as shown in FIG. 14, the p-type impurities are implanted to both the element region 20 and the circumferential region 50. Here, the p-type impurities are implanted substantially perpendicular to the bottom surfaces of the respective trenches. Further, an implantation energy of the p-type impurities is adjusted so that the p-type impurities do not penetrate through the protective films 66 on the side surfaces of the gate trenches 34. Thus, the p-type impurities are not implanted to the side surfaces of the gate trenches 34. The p-type impurities are implanted to the bottom surfaces of the gate trenches 34, and the side surfaces and bottom surfaces of the circumferential trenches 54. Thereafter, the p-type floating regions 32, the bottom surface regions 56, and the side-surface regions 58 are formed by activating the implanted p-type impurities by a heat treatment or the like. Then, the semiconductor device 10 is completed by forming the necessary regions.

Notably, in the aforementioned embodiments, the circumferential trenches 54 are formed in ring shapes that circumscribe the periphery of the element region 20, however, the circumferential trenches 54 do not necessarily need to be in such a ring shape. For example, the circumferential trenches 54 may be provided only partially in the circumferential region 50 at portions where voltage resistance becomes problematic.

Further, in the aforementioned first and second embodiments, the circumferential trenches 54 are provided between the element region 20 and the end faces 12a of the semiconductor substrate 12, however, they may be provided at other locations. For example, a circumferential trench 54 may be provided between two element regions 20.

Further, in the aforementioned embodiments, the MOSFET is provided in the element region 20, however, an IGBT may be provided.

Further, in the aforementioned embodiments, the p-type floating regions 32 are provided at the lower ends of the gate trenches 34, however, p-type regions connected to a predetermined potential may be provided instead of the p-type floating regions 32.

The embodiments have been described in detail in the above. However, these are only examples and do not limit the claims. The technology described in the claims includes various modifications and changes of the concrete examples represented above. The technical elements explained in the present description or drawings exert technical utility independently or in combination of some of them, and the combination is not limited to one described in the claims as filed. Moreover, the technology exemplified in the present description or drawings achieves a plurality of objects at the same time, and has technical utility by achieving one of such objects.

REFERENCE SIGNS LIST

10: Semiconductor Device
12: Semiconductor Substrate
14: Front Surface Electrode
18: Rear Surface Electrode
20: Element Region
22: Source Region
24: Body Contact Region
26: Body Region
28: Drift Region
30: Drain Region
32: P-Type Floating Region
34: Gate Trench
34c: Gate Electrode
50: Circumferential Region
51: Front Surface Region
53: Insulating Layer
54: Circumferential Trench
56: Bottom Surface Region
58: Side Surface Region

The invention claimed is:

1. A semiconductor device comprising:
a semiconductor substrate;
a front surface electrode provided on a front surface of the semiconductor substrate; and
a rear surface electrode provided on a rear surface of the semiconductor substrate;
the semiconductor substrate comprising:
an element region in which an insulated gate type switching element configured to switch between the front surface electrode and the rear surface electrode is provided; and
a circumferential region adjacent to the element region; and
the insulated gate type switching element comprising:
a first region of a first conductivity type connected to the front surface electrode;
a second region of a second conductivity type connected to the front surface electrode and being in contact with the first region;
a third region of the first conductivity type provided under the second region and separated from the first region by the second region;
a gate insulating film being in contact with the second region; and
a gate electrode facing the second region via the gate insulating film,
wherein a first trench and a second trench spaced apart from the first trench are provided in the front surface in the circumferential region,
insulating films are provided in the first trench and the second trench,
a front surface region of the second conductivity type is provided in a front surface side portion of a region between the first trench and the second trench,
a first bottom surface region of the second conductivity type is provided in a range exposed on a bottom surface of the first trench,
a second bottom surface region of the second conductivity type is provided in a range exposed on a bottom surface of the second trench,
a first side surface region of the second conductivity type connecting the front surface region and the first bottom surface region is provided along a side surface of the first trench,
a second side surface region of the second conductivity type connecting the front surface region and the second bottom surface region is provided along a side surface of the second trench, and
a fourth region of the first conductivity type continuous from the third region is provided in a range where the fourth region is in contact with the front surface region, the first bottom surface region, the second bottom surface region, the first side surface region, and the second side surface region,
a first low area density region is provided in at least a part of the first side surface region,
an area density of second conductivity type impurities in the first low area density region measured along a direction perpendicular to the side surface of the first trench is lower than an area density of second conductivity type impurities in the first bottom surface region measured along a thickness direction of the semiconductor substrate,
the first bottom surface region is separated from the front surface region by the first low area density region,
a second low area density region is provided in at least a part of the second side surface region,
an area density of second conductivity type impurities in the second low area density region measured along a direction perpendicular to the side surface of the second trench is lower than an area density of second conductivity type impurities in the second bottom surface region measured along the thickness direction of the semiconductor substrate,
the second bottom surface region is separated from the front surface region by the second low area density region,
the semiconductor substrate is configured of SiC, and
the area density in the first low area density region and the area density in the second low area density region are lower than $3.2 \times 10^{13}$ cm$^{-2}$.

2. A semiconductor device comprising:
a semiconductor substrate;
a front surface electrode provided on a front surface of the semiconductor substrate; and
a rear surface electrode provided on a rear surface of the semiconductor substrate;
the semiconductor substrate comprising:
an element region in which an insulated gate type switching element configured to switch between the front surface electrode and the rear surface electrode is provided; and
a circumferential region adjacent to the element region; and
the insulated gate type switching element comprising:
a first region of a first conductivity type connected to the front surface electrode;

a second region of a second conductivity type connected to the front surface electrode and being in contact with the first region;

a third region of the first conductivity type provided under the second region and separated from the first region by the second region;

a gate insulating film being in contact with the second region; and a gate electrode facing the second region via the gate insulating film, wherein a first trench and a second trench spaced apart from the first trench are provided in the front surface in the circumferential region, insulating films are provided in the first trench and the second trench, a front surface region of the second conductivity type is provided in a front surface side portion of a region between the first trench and the second trench, a first bottom surface region of the second conductivity type is provided in a range exposed on a bottom surface of the first trench, a second bottom surface region of the second conductivity type is provided in a range exposed on a bottom surface of the second trench, a first side surface region of the second conductivity type connecting the front surface region and the first bottom surface region is provided along a side surface of the first trench, a second side surface region of the second conductivity type connecting the front surface region and the second bottom surface region is provided along a side surface of the second trench, and a fourth region of the first conductivity type continuous from the third region is provided in a range where the fourth region is in contact with the front surface region, the first bottom surface region, the second bottom surface region, the first side surface region, and the second side surface region, a first low area density region is provided in at least a part of the first side surface region, an area density of second conductivity type impurities in the first low area density region measured along a direction perpendicular to the side surface of the first trench is lower than an area density of second conductivity type impurities in the first bottom surface region measured along a thickness direction of the semiconductor substrate, the first bottom surface region is separated from the front surface region by the first low area density region, a second low area density region is provided in at least a part of the second side surface region, an area density of second conductivity type impurities in the second low area density region measured along a direction perpendicular to the side surface of the second trench is lower than an area density of second conductivity type impurities in the second bottom surface region measured along the thickness direction of the semiconductor substrate, the second bottom surface region is separated from the front surface region by the second low area density region, the semiconductor substrate is configured of Si, and the area density in the first low area density region and the area density in the second low area density region are lower than $2.0 \times 10^{12}$ cm$^{-2}$.

3. A semiconductor device comprising:

a semiconductor substrate;

a front surface electrode provided on a front surface of the semiconductor substrate; and a rear surface electrode provided on a rear surface of the semiconductor substrate;

the semiconductor substrate comprising:

an element region in which an insulated gate type switching element configured to switch between the front surface electrode and the rear surface electrode is provided; and a circumferential region adjacent to the element region; and the insulated gate type switching element comprising:

a first region of a first conductivity type connected to the front surface electrode;

a second region of a second conductivity type connected to the front surface electrode and being in contact with the first region;

a third region of the first conductivity type provided under the second region and separated from the first region by the second region;

a gate insulating film being in contact with the second region; and a gate electrode facing the second region via the gate insulating film, wherein a first trench and a second trench spaced apart from the first trench are provided in the front surface in the circumferential region, insulating films are provided in the first trench and the second trench, a front surface region of the second conductivity type is provided in a front surface side portion of a region between the first trench and the second trench, a first bottom surface region of the second conductivity type is provided in a range exposed on a bottom surface of the first trench, a second bottom surface region of the second conductivity type is provided in a range exposed on a bottom surface of the second trench, a first side surface region of the second conductivity type connecting the front surface region and the first bottom surface region is provided along a side surface of the first trench, a second side surface region of the second conductivity type connecting the front surface region and the second bottom surface region is provided along a side surface of the second trench, and a fourth region of the first conductivity type continuous from the third region is provided in a range where the fourth region is in contact with the front surface region, the first bottom surface region, the second bottom surface region, the first side surface region, and the second side surface region, a first low area density region is provided in at least a part of the first side surface region, an area density of second conductivity type impurities in the first low area density region measured along a direction perpendicular to the side surface of the first trench is lower than an area density of second conductivity type impurities in the first bottom surface region measured along a thickness direction of the semiconductor substrate, the first bottom surface region is separated from the front surface region by the first low area density region, a second low area density region is provided in at least a part of the second side surface region, an area density of second conductivity type impurities in the second low area density region measured along a direction perpendicular to the side surface of the second trench is lower than an area density of second conductivity type impurities in the second bottom surface region measured along the thickness direction of the semiconductor substrate, the second bottom surface region is separated from the front surface region by the second low area density region, and the first low area density region and the second low area density region are depleted when a maximum rated voltage is applied to the insulated gate type switching device in an off state.

4. The semiconductor device of claim 1, wherein
the semiconductor substrate is configured of SiC, and
the area density in the first bottom surface region and the area density in the second bottom surface region are equal to or higher than $1.5 \times 10^{13}$ cm$^{-2}$.

5. The semiconductor device of claim 2, wherein
the semiconductor substrate is configured of Si, and
the area density in the first bottom surface region and the area density in the second bottom surface region are equal to or higher than $1.9 \times 10^{12}$ cm$^{-2}$.

6. The semiconductor device of claim 3, wherein at least a part of the first bottom surface region and at least a part of the second bottom surface region are not depleted when a maximum rated voltage is applied to the insulated gate type switching device in an off state.

7. A method for manufacturing the semiconductor device of claim 1, the method comprising:

forming the first trench and the second trench in the front surface of the semiconductor substrate in the circumferential region and forming a gate trench in the front surface of the semiconductor substrate in the element region so that a taper angle of the first trench and a taper angle of the second trench are larger than a taper angle of the gate trench;

forming a protective film on inner surfaces of the first trench, the second trench, and the gate trench; and implanting second conductivity type impurities to the semiconductor substrate, wherein, in the implantation, the second conductivity impurities pass through the protective film on a bottom surface of the gate trench so as to be implanted to the bottom surface of the gate trench, the second conductivity impurities are prevented from being implanted to the side surface of the gate trench by the protective film on the side surface of the gate trench, the second conductivity impurities pass through the protective film on the bottom surfaces of the first and second trenches so as to be implanted to the bottom surfaces of the first and second trenches, and the second conductivity impurities pass through the protective film on the side surfaces of the first and second trenches so as to be implanted to the side surfaces of the first and second trenches.

8. A method for manufacturing the semiconductor device of claim 1, the method comprising:

forming the first trench and the second trench in the front surface of the semiconductor substrate in the circumferential region and forming a gate trench in the front surface of the semiconductor substrate in the element region; and implanting second conductivity type impurities to the front surface of the semiconductor substrate at an oblique angle in a state where a circumferential region mask having openings corresponding to the first trench and the second trench is provided on the front surface of the semiconductor substrate in the circumferential region and an element region mask thicker than the circumferential region mask and having an opening corresponding to the gate trench is provided on the front surface of the semiconductor substrate in the element region, wherein, in the implantation, the second conductivity impurities are implanted to the side surfaces of the first and second trenches and prevented from being implanted to the side surface of the gate trench by the element region mask.

9. A method for manufacturing the semiconductor device of claim 1, comprising:

forming the first trench and the second trench in the front surface of the semiconductor substrate in the circumferential region and forming the gate trench in the front surface of the semiconductor substrate in the element region so that a taper angle of the first trench and a taper angle of the second trench are larger than a taper angle of the gate trench;

forming a protective film on inner surfaces of the first trench, the second trench, and the gate trench;

removing the protective film located on the side surfaces and the bottom surfaces of the first and second trenches and on the bottom surface of the gate trench by anisotropic etching; and implanting second conductivity type impurities to the semiconductor substrate, wherein, in the implantation, the second conductivity type impurities are implanted to the side surfaces and the bottom surfaces of the first and second trenches and the bottom surface of the gate trench, and are prevented from being implanted to the side surface of the gate trench by the protective film.

* * * * *